US006735848B1

(12) United States Patent
Markiewicz et al.

(10) Patent No.: US 6,735,848 B1
(45) Date of Patent: May 18, 2004

(54) METHOD OF MANUFACTURING A SUPERCONDUCTING MAGNET

(75) Inventors: W. Denis Markiewicz, Tallahassee, FL (US); Iain R. Dixon, Tallahassee, FL (US); Charles A. Swenson, Tallahassee, FL (US); W. Scott Marshall, Tallahassee, FL (US); Robert P. Walsh, Tallahassee, FL (US); Thomas Painter, Tallahassee, FL (US); Steven van Van Sciver, Tallahassee, FL (US)

(73) Assignee: FSU Research Foundation, Inc., Tallahassee, FL (US)

( * ) Notice: Subject to any disclaimer, the term of this patent is extended or adjusted under 35 U.S.C. 154(b) by 353 days.

(21) Appl. No.: 09/668,992

(22) Filed: Sep. 25, 2000

Related U.S. Application Data

(60) Provisional application No. 60/156,081, filed on Sep. 24, 1999.

(51) Int. Cl.[7] .............................................. H01L 39/24

(52) U.S. Cl. ...................... 29/599; 29/605; 29/890.036; 174/125.1; 324/248; 335/216; 505/430

(58) Field of Search ..................... 29/599, 605, 890.03, 29/890.036, 890.037; 174/125.1; 324/315, 318, 333, 248; 333/219.2, 234; 335/216, 296; 600/409; 505/430, 846, 879

(56) References Cited

U.S. PATENT DOCUMENTS

| | | | | | |
|---|---|---|---|---|---|
| 4,500,860 | A | * | 2/1985 | Vermilyea | 29/599 |
| 4,744,506 | A | | 5/1988 | Thornton | |
| 4,808,954 | A | * | 2/1989 | Ito | 335/216 |
| 4,895,831 | A | * | 1/1990 | Laskaris | 505/163 |
| 5,581,220 | A | * | 12/1996 | Rodenbush et al. | 335/216 |
| 5,606,300 | A | * | 2/1997 | Koyama et al. | 335/216 |
| 5,689,223 | A | * | 11/1997 | Demarmels et al. | 335/216 |
| 5,690,991 | A | | 11/1997 | Xu et al. | |
| 5,721,522 | A | | 2/1998 | Roth et al. | |
| 5,739,689 | A | | 4/1998 | Roth et al. | |
| 5,872,500 | A | | 2/1999 | Gore | |
| 5,884,489 | A | | 3/1999 | Retz et al. | |
| 5,900,792 | A | | 5/1999 | Havens et al. | |
| 5,917,393 | A | * | 6/1999 | Kupiszewski et al. | 335/216 |
| 6,081,987 | A | * | 7/2000 | Kalsi et al. | 29/599 |

OTHER PUBLICATIONS

Eyssa, Markiewicz, "Quench Simulation and Thermal Diffusion in Epoxy–Impregnated Magnet System," 5 IEEE Trans. Applied Superconductivity, No. 2, 487–90 (1995).

Markiewicz, Dixon, Eyssa, Schwartz, Swenson, Van Sciver, Schneider–Muntau, "25 T High Resolution NMR Magnet Program and Technology," 32 IEEE Trans. Magnetics, No. 4, 2586–89 (1996).

Markiewicz, Bonney, Dixon, Eyssa, Swenson, Schneider-Muntau, "Technology of 1 Ghz NMR superconducting magnets," 216 Physica B, 200–02 (1996).

(List continued on next page.)

*Primary Examiner*—Peter Vo
*Assistant Examiner*—Donghai Nguyen
(74) *Attorney, Agent, or Firm*—Senniger, Powers, Leavitt & Roedel

(57) ABSTRACT

Method of manufacture a wide bore, high field superconducting magnet. The superconducting magnet has a plurality of superconducting coils impregnated with epoxy and nested within each other. An innermost one of the nested coils has a bore therethrough that defines a bore width of the magnet. The bore width is greater than approximately 100 millimeters. The nested coils are electrically connected in series and cooled to an operating temperature less than approximately 4 degrees K. The magnet also has external reinforcements on the coils that are applied prior to impregnating the coils with epoxy. An active protection circuit protects the coils in response to a quench in the magnet. The protection circuit includes heater elements positioned in thermal contact with the coils prior to impregnating the coils with epoxy. The magnet further has lead supports for supporting the lead wires with epoxy that extend from the coils.

32 Claims, 10 Drawing Sheets

OTHER PUBLICATIONS

Swenson, Dixon, Markiewicz, "Measurement of Thermal Contraction Properties for NbTi and $Nb_3Sn$ Composites," 7 IEEE Trans. Applied Superconductivity, No. 2, 408–11 (1997).

Swenson, Markiewicz, "Development of Quench Protection Heaters for Superconducting Solenoids," 7 IEEE Trans. Applied Superconductivity, No. 2, 402–03 (1997).

Dixon, Walsh, Markiewicz, Swenson, "Mechanical Properties of Epoxy Impregnated Superconducting Solenoids,"32 IEEE Trans. Magnetics, No. 4, 2917–20 (1996).

Swenson, Eyssa, Markiewicz, "Quench Protection Heater Design for Superconducting Solenoids," 32 IEEE Trans. Magnetics, No. 4, 2659–62 (1996).

Eyssa, Markiewicz, Miller, "Quench , Thermal, and Magnetic Analysis Computer Code for Superconducting Solenoids," 7 IEEE Trans. Applied Superconductivity, No. 2, 159–62 (1997).

Markiewicz, "1 Ghz NMR spectroscopy: innovation in magnet technology," 9 Solid State Nuclear Magnetic Resonance, 73–76 (1997).

Markiewicz, Dixon, Eyssa, Schwartz, Swenson, Schneider-Muntau, "The Evolution of Adiabatically Stable Magnet Technology for High Field Nuclear Magnetic Resonance," High Magnetic Fields: Application, Generation, Materials, World Scientific, River Edge, NJ, 287–295 (1997).

Dixon, Markiewicz, Pickard, Swenson, "Critical Current and n–Value of $Nb_3Sn$ Conductors for the Wide Bore 900 MHZ NMR Magnet," 9 IEEE Trans. Applied Superconductivity, No. 2, 2513–16 (1999).

Eyssa, Markiewicz, Swenson, "Quench Heater Simulation for Protection of Superconducting Coils," 9 IEEE Trans. Applied Superconductivity, No. 2, 1117–20 (1999).

* cited by examiner

METHOD OF MANUFACTURING A SUPERCONDUCTING MAGNET

CROSS-REFERENCE TO RELATED APPLICATION

This application claims the benefit of commonly assigned Provisional Application Serial No. 60/156,081, filed Sep. 24, 1999, the entire disclosure of which is incorporated herein by reference.

STATEMENT REGARDING FEDERALLY SPONSORED RESEARCH OR DEVELOPMENT

This invention was made with Government support under Cooperative Agreement Nos. DMR-9016241 and/or DMR-9527035 awarded by the National Science Foundation. The Government has certain rights in this invention.

BACKGROUND OF THE INVENTION

The invention relates generally to a high field magnet and, particularly, to a high field superconducting magnet having a wide bore for use in a nuclear magnetic resonance (NMR) spectrometer.

The technique of NMR has proven to be a powerful and unique tool for the study of complex molecular structures. High current density superconducting magnets are particularly well suited to provide the magnetic field uniformity and persistence required for NMR. As a result, a relationship exists between the available range of application of NMR spectroscopy, in field and sample volume, and the state of the technology of high current density superconducting magnets. Traditionally, increased field strength in high resolution NMR magnets has been sought for the study of the structure of molecules of increasing size. The number of spectral lines associated with larger molecules requires the increased line separation and sensitivity afforded by higher fields. Recently, unexpected benefits of high fields have been realized due to mechanisms of line width minimization at fields being approached in available spectrometer magnets. As a result, the motivation for increased field strength in NMR magnets is greater than ever. There are currently a number of programs under way with the objective of NMR at 1 GHz, corresponding to 23.5 T, and above. The possibility of these high fields depends, as a necessary condition, on the availability of a superconductor and associated coil technology for that field.

Given the scientific and commercial importance of NMR and the associated spectrometer magnets, there is motivation to address the technology of high current density superconducting magnets. More specifically, very high field NMR magnet technology is desired for instrumentation to support high field NMR research and to provide a wide bore 900 MHz spectrometer magnet. Such a magnet is also desired because the technology development activities directed toward the requirements of the 900 MHz magnet specifically are also applicable generally to high field NMR magnets, to high field, high current density superconducting magnets, and more generally to many aspects of magnet technology regardless of the type of conductor and construction being employed.

Moreover, a high field magnet with a larger bore than presently available is desired. Those skilled in the art believe that such a wide bore or large bore magnet will serve as an essential stepping stone to 1 GHz or higher frequency systems. Due to the high stored energy of the 900 MHz system and the associated large magnetic forces, however, the production of a successful system is challenging.

In general, a magnet of this type employs $Nb_3Sn$ and NbTi conductors in a set of epoxy impregnated long solenoids plus compensation coils for uniformity. The high field and large bore result in large mechanical stress in the coils and large magnetic stored energy. Therefore, reinforcement of the windings and an active protection system is desired.

Moreover, magnetic field uniformity is critical to NMR. Ferromagnetic welds cause field inhomogeneity. Historically, magnet designs have avoided ferrous structural alloys to prevent potential field distortions from welds. This strategy is problematic in fabricating high field magnets because austenitic stainless steel is the preferred heat treatment material for bore tubes in $Nb_3Sn$ coils. Early high field NMR designs employed the removal of the bore tubes after heat treatment and epoxy impregnation. Bore tube removal is dangerous due to the risk of damaging the reacted $Nb_3Sn$ conductor and leads. A more practicable fabrication approach is to leave the stainless steel bore tubes in place. For this reason, a weld metal on the coil form that avoids magnetic fields is desired.

A major obstacle to producing a wide bore, high field magnet involves the relatively large mechanical stresses caused by the magnetic fields in the magnet. Energizing a wound coil with an electric current produces a magnetic field accompanied by an associated mechanical stress in the coil. As the strength of the magnetic field produced by the coil increases, the magnitude of the mechanical stress increases as well. In this instance, a magnetic coil wound with superconductor produces a very high field and, thus, mechanical stresses become an important design factor.

In general, superconductors are composite materials in the form of flat tapes or wires (round or rectangular). The composite conductor typically includes copper or silver for protection and stabilization in addition to a superconducting alloy or compound. The composite conductor may also have substantial fractions of other materials (e.g., bronze). Unfortunately, the materials normally found in high field superconductors are generally of low strength and the high temperature heat treatment and annealing to which such conductors are subject diminishes their strength even further. For this reason, a magnetic coil structure providing sufficient strength to withstand the high mechanical stresses that appear in the windings of a high field magnetic coil is desired. There have been some attempts at high strength versions of superconductors, but even these materials would benefit from additional high strength supporting materials in high field magnet applications.

Magnetic coils used for the production of high magnetic fields are often cylindrical in form. In a cylindrical coil, there are two main components to the mechanical forces in the windings. First, a force in a radially outward direction generally tends to expand the diameter of the coil. Second, an axial force at each end of the coil toward the center results in a pressure at the midplane of the coil and tends to make the coil shorter. Both of these forces can produce excess mechanical stress on the conductor. Therefore, magnet reinforcement is desired for containing the radial component of the force to limit the radial expansion of the windings as well as containing the axial component of the force to reduce the pressure on the conductor at the center of the coil about the midplane.

Those skilled in the art are familiar with reinforcing a cylindrical magnetic coil by applying structural material to the outside surface of the coil. The added material forms a secondary cylindrical structure in contact with the cylindrical structure of the coil windings. For example, high strength wire wound into place over the magnetic coil provides reinforcement for the conductor in the coil. This construction has strength in the radial direction, against the expansion of the hoops formed by the reinforcement winding, but can be weak in the axial direction, where any spaces between the turns in the reinforcement winding reduce the stiffness in the axial direction. External reinforcement of this type may be applied without additional bonding material, relying on winding tension alone to hold the reinforcement winding in position, but is commonly applied along with a bonding material such as epoxy. The epoxy serves to fill any gaps between the turns in the reinforcement winding and to increase the stiffness of the reinforcement in the axial direction.

Those skilled in the art recognize that the forces or stresses on the magnet increase as the strength of the magnetic field increases. The so-called A15 high field superconductors, including $Nb_3Sn$, are used to produce coils with the highest fields and forces but also tend to be the most brittle and subject to damage from mechanical stress. Unfortunately, the fabrication process for this type of coil places restrictions on the manner in which the reinforcement can be included in the design. One method of fabricating a high field superconducting coil, commonly referred to as "wind and react," begins with winding the coil with an intermediate stage of conductor. The coil is then heat treated in a furnace at high temperature allowing the components of the intermediate stage conductor to react to form the final superconducting compound. The coil may then be finished by impregnation with an epoxy to secure the relatively weak, brittle superconducting wires and fragile insulation. $Nb_3Sn$ and the other A15 superconductors, for example, are referred to as "wind and react" conductors because they undergo a heat treating process to form the actual superconducting material.

The conventional process of externally reinforcing the coil involves applying the winding on the outside of the finished, epoxy impregnated coil. There are two major drawbacks to this method. In order to apply the reinforcement winding to the finished coil, after the coil is epoxy impregnated and essentially complete as an electrical winding, the coil must be refitted in the winding machine for the application of the reinforcement. This requirement is not severe for a small coil, but as the size of the coil increases for higher field magnets, this processing step becomes increasingly burdensome. Furthermore, this situation makes it difficult to achieve a strong bond between the reinforcement and the coil winding because the reinforcement winding is being applied over a completed, epoxy impregnated winding. The bond of fresh epoxy over already cured epoxy at the interface between the coil winding and the reinforcement winding will have a strength inferior to the shear strength within the windings themselves.

Although applying the reinforcement winding over the conductor winding after heat treatment, but before epoxy impregnation, would solve the problem of the epoxy bond strength, the conductor in the coil after heat treatment is sufficiently brittle that the application of the reinforcement before impregnation of the winding would present a large risk to the integrity of the conductor. Therefore, this option is not available.

For these reasons, an improved method of applying external reinforcement windings to a high field superconducting coil that achieves the objective of providing structural reinforcement in the radial and axial directions and which is compatible with the other process requirements of these coils is desired.

Adequate quench protection presents another obstacle to producing high field magnets. Since superconducting magnets are designed to produce high magnetic fields, they store relatively large amounts of magnetic energy in normal operation. Superconducting magnets are subject to a mode of failure, known as "quench," in which the stored energy is suddenly converted into heat accompanied by the presence of large electrical voltages. A quench occurs when there is a transition from the superconducting state to the normal state of the conductor in some region of the coil. In the normal state, the conductor has an electrical resistance and is heated by the current in the magnet. If the region is of limited size, and all the energy of the magnet is deposited in the region, the energy density is high and the region will be likely to overheat. The excessive heat and voltage during a quench can damage a magnet's windings. Although systems are known for protecting the magnet from damage due to a quench fault condition, these conventional systems are not well-suited for high field superconducting magnets such as those desired for NMR.

With some superconducting magnets, it is possible to remove the stored energy from the coil using an external dump resistor and switch. When a quench detector senses the quench condition in the magnet, a protective circuit opens the switch to essentially create a series circuit of inductor and resistor. The magnet largely deposits its stored energy in the external resistor as it decays with a time constant characteristic of such circuits. Although this type of protection system may be suitable for superconducting magnets that operate at relatively high current in powered mode, an external dump of energy is not practical for NMR spectrometer magnets that operate at relatively low current in persistent mode.

One alternative to removing the magnetic stored energy during a quench condition is to dissipate the energy internally to the magnet windings. A quench is usually a local phenomenon and, thus, the energy will dissipate locally. In this instance, the local region will overheat and be damaged if enough energy is available in the magnet. Distributing the energy somewhat uniformly over the entire volume of the magnet will help prevent overheating any one portion of the windings. Conventional protection systems are available for distributing the stored energy in the magnet. The particular type of system used depends on the type of magnet involved.

In a single coil magnet, which is a single, thermally-connected structure, conventional protection techniques involve electrically subdividing the coil into sections and providing a shunt path for each section. The shunt may consist of a resistor in parallel with the coil section, a diode in parallel with the coil section, or a series combination of a resistor and a diode in parallel with the coil section. In the event of a quench in one section, the current can shift into the shunt parallel with that section, and reduce the heating in the section that quenched. This hopefully will provide sufficient time for the quench to propagate by thermal conduction to the other sections of the coil, increasing the volume of the coil over which the heat is dissipated and thereby reducing the temperature. Spreading the quench of a superconducting coil throughout the coil in the event that one region of the coil quenches is the basic purpose and function of quench protection systems for magnets that are internally protected. Protection systems differ in the way these objectives are achieved. Unfortunately, use of the shunt path to spread the quench only works for coil sections that are thermally connected. In a magnet of multiple independent coils, the quench cannot thermally propagate to other coil sections.

Therefore, a circuit is desired for the protection of large magnets with large stored energy and risk associated with quench that is able to spread the quench of a superconducting coil throughout the coil in the event that one region of the coil quenches.

Yet another problem associated with conventional magnet design involves the leads of the superconducting coil. Mechanical stress on the lead wire extending from a coil, resulting from Local Lorentz forces or relative motion between the coil and the surrounding support structure, for example, can damage the lead wire. Moreover, certain known high field superconductors formed by a high temperature heat treatment are relatively brittle. Thus, the amount of bending allowed by the superconductor is very limited after heat treatment. For this reason, the conductor is often wound while it is still relatively ductile prior to heat treatment. The conductor, however, must be placed in a final position before heat treatment, held in that position during heat treatment, and kept free from bending after heat treatment. Therefore, it is necessary to position the lead from a superconducting coil during winding and to maintain that position during and after heat treatment until the lead can be formed into a structure designed to prevent it from being damaged.

U.S. Pat. No. 5,739,689, the entire disclosure of which is incorporated herein by reference, discloses a superconducting NMR magnet configuration. U.S. Pat. Nos. 5,690,991 and 4,744,506, the entire disclosure of which are incorporated herein by reference, teach superconducting joints for use in superconducting magnets.

SUMMARY OF THE INVENTION

The invention meets the above needs and overcomes the deficiencies of the prior art by providing an improved 900 MHz wide bore NMR spectrometer magnet. Among the several objects and features of the present invention may be noted the provision of such magnet that provides increased field strength; the provision of such magnet that provides a higher spectrometer frequency; the provision of such magnet that permits a wide bore; and the provision of such magnet that is economically feasible.

Briefly described, a method of manufacturing a superconducting magnet embodying aspects of the invention begins with winding a plurality of superconducting coils. The method also includes the steps of impregnating the coils with epoxy and nesting the coils within each other. An innermost one of the nested coils has a bore through it that defines a bore width of the magnet. In this instance, the bore width is greater than approximately 100 millimeters. The method further includes electrically connecting the nested coils in series, cooling the nested coils to an operating temperature less than approximately 4 degrees K, and supplying power to the nested coils for charging the magnet.

Another embodiment of the invention is also directed to a method of manufacturing a superconducting magnet. The method begins with the steps of winding a plurality of superconducting coils and externally reinforcing at least one of the coils. The method continues with impregnating the coils with epoxy after the reinforcing step and nesting the coils within each other. The method further includes the steps of electrically connecting the nested coils in series, cooling the nested coils to an operating temperature less than approximately 4 degrees K, and supplying power to the nested coils for charging the magnet.

In yet another embodiment, a method of manufacturing a superconducting magnet begins with the steps of winding a plurality of superconducting coils and positioning a heater element in thermal contact with one or more of the coils for heating the coils in response to a quench in the magnet. The method continues with impregnating the coils with epoxy after positioning the heater element and nesting the coils within each other. The method further includes the steps of electrically connecting the nested coils in series, cooling the nested coils to an operating temperature less than approximately 4 degrees K, and supplying power to the nested coils for charging the magnet.

Another embodiment of the invention is directed to a method of manufacturing a superconducting magnet beginning with winding a plurality of superconducting coils. The method also includes placing a mold around one or more of the lead wires adjacent an end of the respective coil. In this method, the mold defines a generally frustoconical region surrounding at least a portion of the lead wire. The method continues with the step of impregnating the coils with epoxy, which causes the mold to fill with epoxy, and the step of nesting the coils within each other. The method further includes the steps of electrically connecting the nested coils in series, cooling the nested coils to an operating temperature less than approximately 4 degrees K, and supplying power to the nested coils for charging the magnet.

A superconducting magnet embodying aspects of the invention includes a plurality of superconducting coils impregnated with epoxy and nested within each other. An innermost one of the nested coils has a bore through it that defines a bore width of the magnet. In this instance, the bore width is greater than approximately 100 millimeters. The nested coils are electrically connected in series and cooled to an operating temperature less than approximately 4 degrees K.

Another embodiment of the invention is a superconducting magnet having a plurality of superconducting coils impregnated with epoxy and nested within each other. The nested coils are electrically connected in series and cooled to an operating temperature less than approximately 4 degrees K. The magnet also includes an external reinforcement on at least one of the coils. The external reinforcement is applied prior to impregnating the coil to be reinforced with epoxy.

Yet another embodiment of the invention is a superconducting magnet having a plurality of superconducting coils impregnated with epoxy and nested within each other. The nested coils are electrically connected in series and cooled to an operating temperature less than approximately 4 degrees K. The magnet also includes an active protection circuit for protecting one or more of the coils in response to a quench in the magnet. The protection circuit has at least one heater element for heating the protected coil. The heater element is positioned in thermal contact with the protected coil prior to impregnating the coil with epoxy.

In another embodiment, a superconducting magnet includes a plurality of superconducting coils impregnated with epoxy and nested within each other. The nested coils are electrically connected in series and cooled to an operating temperature less than approximately 4 degrees K. The coils have lead wires extending from them and the magnet has a lead support for supporting each of the lead wires with epoxy adjacent an end of the respective coil.

Alternatively, the invention may comprise various other methods and systems.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
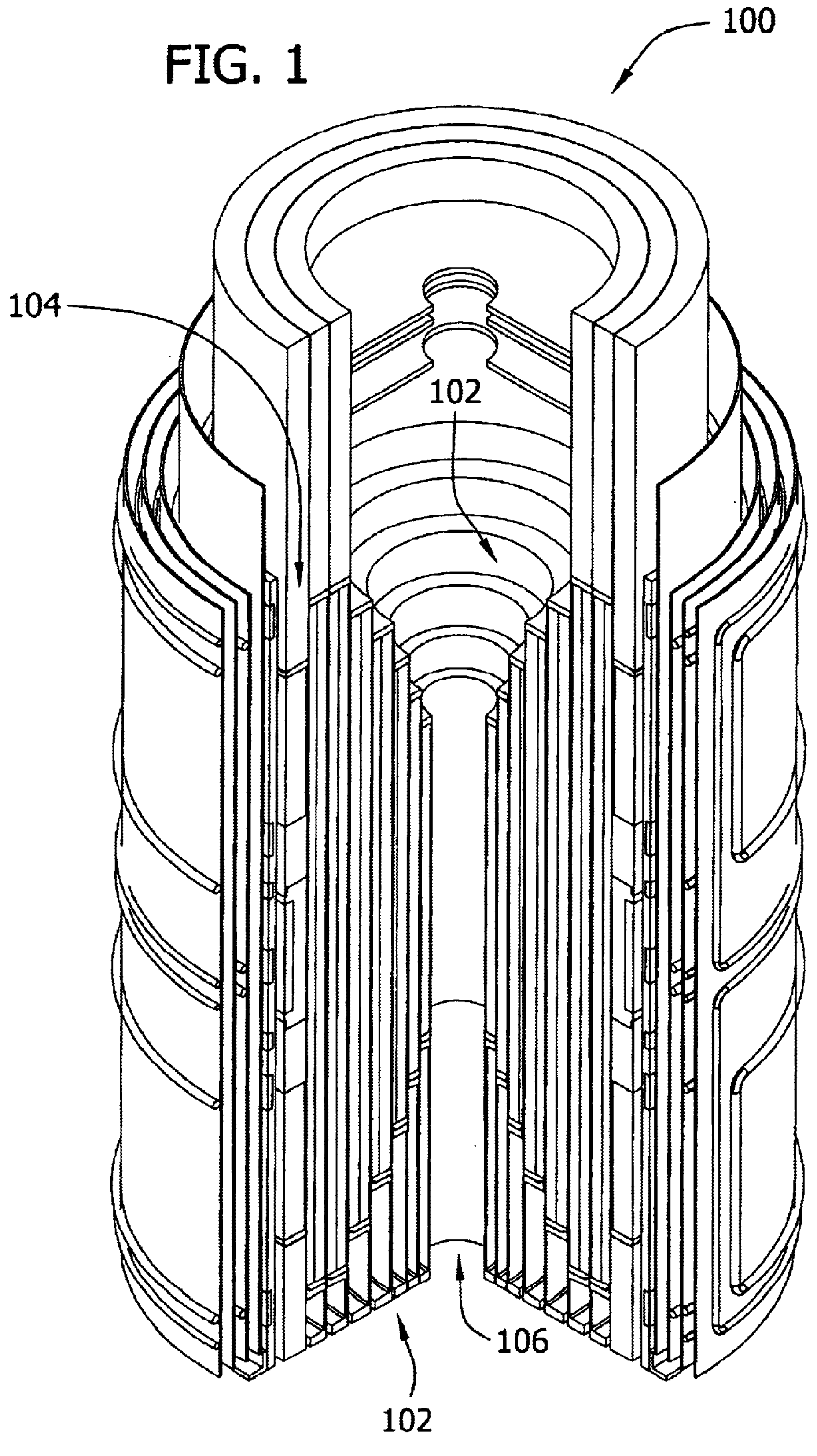
FIG. 1 is a perspective view of a wide bore, high field superconducting magnet, having portions shown in section, according to a preferred embodiment of the invention.
Figure 2:
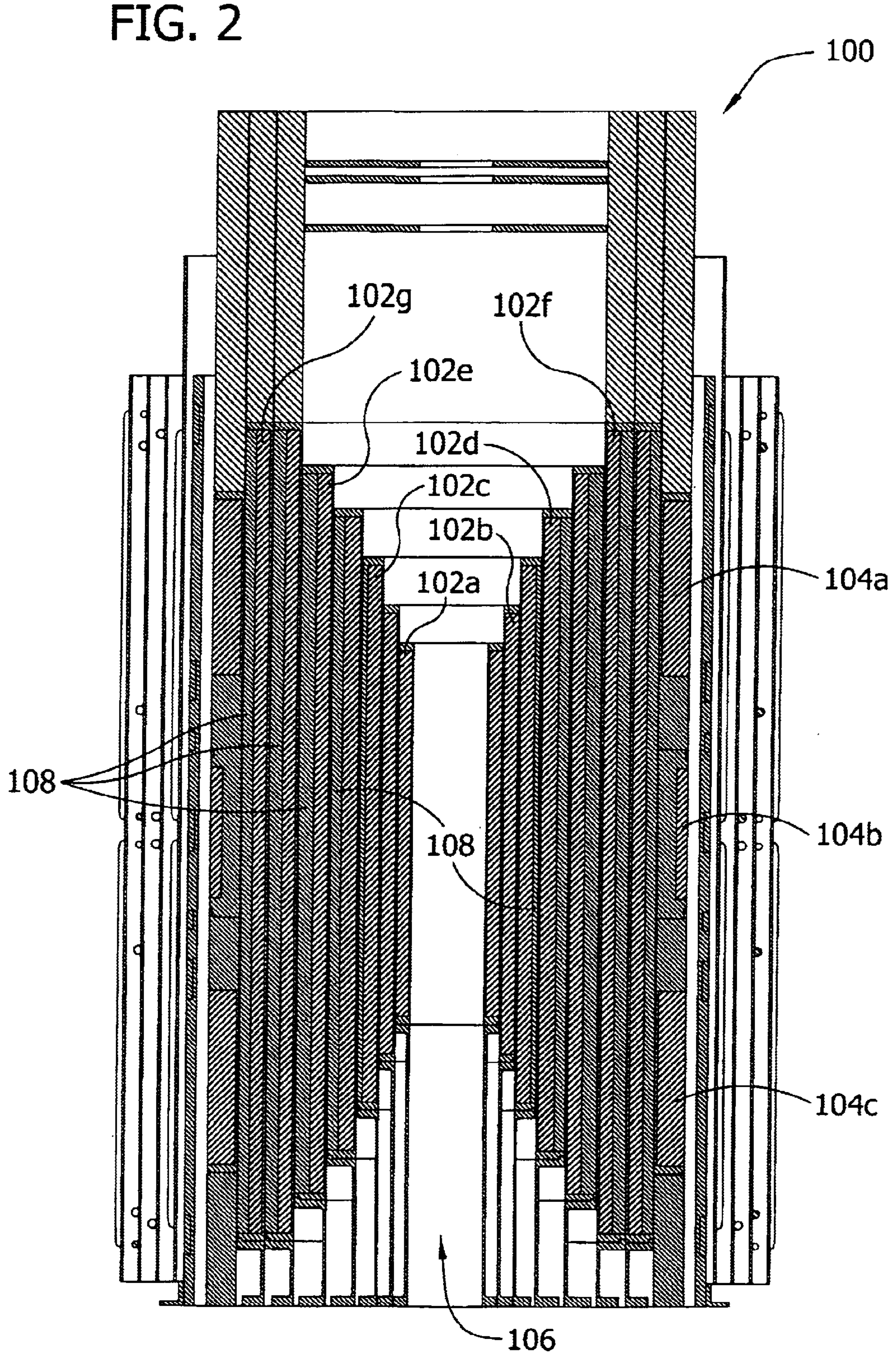
FIG. 2 is a cross sectional view of the magnet of FIG. 1.
Figure 5:
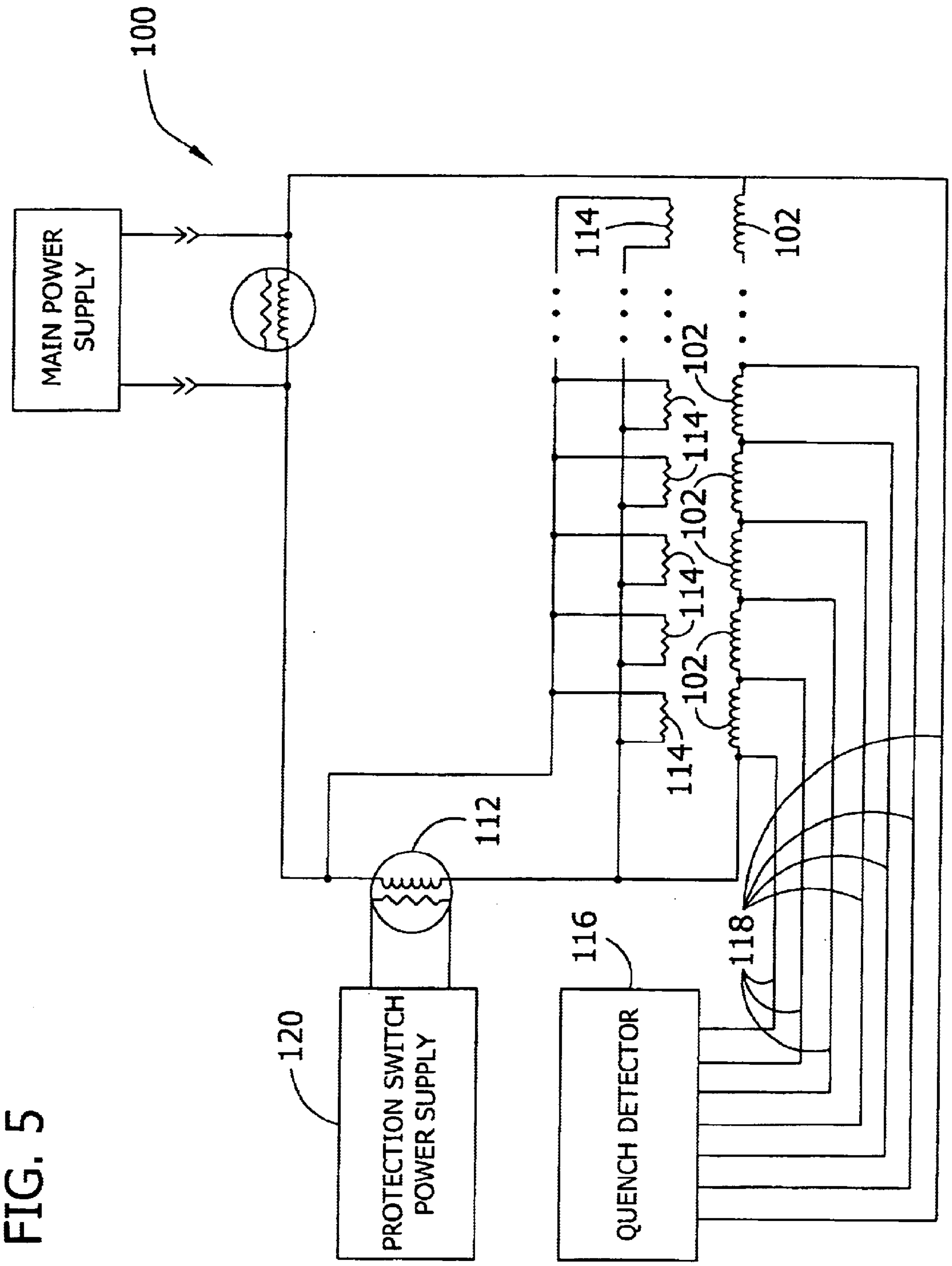
FIG. 5 is a schematic diagram of an active quench protection circuit for use with the magnet of FIG. 1.

Referring now to the drawings, FIGS. 1 and 2 show a wide bore, high resolution NMR magnet 100. The magnet 100 preferably provides a spectrometer frequency of 900 MHz and a field of 21.1 T in operation within a cryostat (not shown) at approximately 1.8 degrees K. In general, magnet 100 has a plurality of coils 102 of high current density $Nb_3Sn$ and NbTi conductors in a set of epoxy impregnated long solenoids. Magnet 100 also includes a set of compensation coils 104 for uniformity. The high field and the relatively large bore, indicated generally at 106, cause large mechanical stress in the coils 102 in addition to large magnetic stored energy. Advantageously, magnet 100 includes lumped external reinforcement 108 for handling the stress in coils 102 and employs an active quench protection system 112 (see FIG. 5). The layout of magnet 100, including its individual coils 102, is shown in cross section in FIG. 2. The five inner most coils 102*a*–102*e* are preferably constructed with bronze process, multifilimentary $Nb_3Sn$ superconductor. In this embodiment, the five outer coils, i.e., coils 102*f,* 102*g* and 104*a*–104*c,* are constructed using monolithic NbTi superconductor; the two coils 102*f*, 102*g* being long solenoids and the three coils 104*a*–104*c* completing a set of compensation coils.

In a preferred embodiment of the invention, the warm bore width of bore 106 is approximately 110 mm and the cold bore width of bore 106 is approximately 138 mm. The largest coil height is approximately 1.5 m and its maximum outside diameter is approximately 878 mm. Other main magnet parameters of the 900 MHz wide bore magnet 100 include a current of 290 A, inductance of 953 H and stored energy of 40 MJ (see Table I).

The magnet 100 preferably has a standard configuration for NMR, especially with combined requirements of high field and uniformity. As described above, coils 102 preferably include low temperature superconductors (e.g., $Nb_3Sn$ and NbTi conductors) having a cryogenic operating temperature of approximately 1.8 degrees K. FIG. 2 shows the five inner $Nb_3Sn$ solenoids 102*a*–102*e* surrounded by two NbTi solenoids 102*f*, 102*g* and three compensation coils 104*a*–104*c*. The compensation coils 104 in this embodiment are also windings of NbTi. Preferably, magnet 100 also has a plurality of shim coils external to the coil compensation set 104. It is to be understood that a four coil compensation set is also contemplated. Such a four coil set may lead to an increase in size, however, because it has counter wound coils.

With a warm bore width on the order of 100 mm or more, bore 106 is significantly larger than that of a conventional standard bore high resolution NMR magnet. In general, a wide bore raises problems for the room temperature shims of increasing high order. The present invention preferably configures the wide bore 900 MHz magnet 100 in two different modes. First, a high resolution mode employs a room temperature shim set of conventional standard bore diameter. Second, the larger bore shim set has fewer high order shims and results in a reduction of achievable field uniformity, as might be appropriate for solid state NMR and micro-imaging.

As described above, the 900 MHz magnet 100 is generally an assembly of $Nb_3Sn$ and NbTi coils 102, 104. The first five inner coils 102*a*–102*e* are preferably made using $Nb_3Sn$ wind and react technology. A separate grade of rectangular conductor is wound on each stainless steel coil form. In a preferred embodiment, coils 102*c*–102*g* have external reinforcement 108 (see FIGS. 3 and 4) wound thereon. The conductors in magnet coils 102, 104 and in the reinforcement windings 108 are preferably insulated with glass fiber (e.g., S-2) and impregnated with epoxy. As described below, the reinforcements 108 are applied prior to epoxy impregnation of the reinforced coils 102*c*–102*g,* and prior to heat treatment for the $Nb_3Sn$ coils 102*c*–102*e,* to ensure a strong bond between the conductor winding and the reinforcement winding.

High quality bronze process conductors of increasingly high critical current density in increasingly large cross section help provide advances in field strength of superconducting NMR magnets. As an example, a conductor with a cross sectioned area of 6.35 $mm^2$ sets the operating current at 290 A. For example, a bronze process $Nb_3Sn$ monolith conductor from VAC may be used based on persistent joint requirements, n-value and mechanical properties of conductor. With respect to the construction of the NbTi coils, Intermagnetics General Corporation supplies a suitable NbTi monolith conductor, also having S-2 glass fiber insulation. Table I provides exemplary parameters for 900 MHz wide bore magnet 100.

TABLE I

| PARAMETER | VALUE |
|---|---|
| Central field | 21.1 T |
| Operating temperature | 1.8° K. |
| Cold bore | 138 mm |
| Maximum outer diameter of windings | 878 mm |
| Maximum height of windings | 1500 mm |
| Weight $Nb_3Sn$ conductor | 921 kg |
| Weight $Nb_3Sn$ reinforcement | 593 kg |
| Weight NbTi conductor | 1273 kg |
| Weight NbTi reinforcement | 824 Kg |
| Operating current | 290 A |
| Inductance | 953 H |
| Stored energy | 40 MJ |

The amount of superconductor used for each coil 102, 104, i.e., the fraction of superconducting component in the conductor of each coil, depends directly on the maximum field and the critical current density of the superconductor.

Those skilled in the art recognize that persistent decay and n-value considerations dictate operating at a fraction of the critical current in an NMR magnet. In lower fields, given the typically higher n-values at lower fields, higher fractions of critical current may be used. Typical fractions for all coils 102, 104 in magnet 100 span the range of 0.6 to 0.7.

The copper in each conductor in the 900 MHz magnet 100 is selected on the basis of protection considerations. In one embodiment, the copper content is designed to meet the requirements for protection alone, and not to satisfy the mechanical requirements of the windings. The actual amount of copper used is a function of the entire design and performance of the protection system.

As described above, an improved method of externally reinforcing the windings of a high field superconducting coil is needed to provide structural reinforcement in both the radial and axial directions while being compatible with the other process requirements of these coils. Those skilled in the art recognize the magnetic and thermal loads during operation of a superconducting magnet cause stresses within the magnet. In a preferred embodiment of the invention, magnet 100 includes additional material on at least some of the coils 102 for mechanical support due to the large mechanical forces and the limited allowable tangential strain in coils 102. Preferably, the additional material for mechanical support of the magnet's windings is supplied in the form of external reinforcement windings 108. In the illustrated embodiment, the reinforcement windings 108 support the $Nb_3Sn$ conductors of coils 102*c*–102*e* and the NbTi conductors of coils 102*f*, 102*g* in a like manner.

Figure 3:
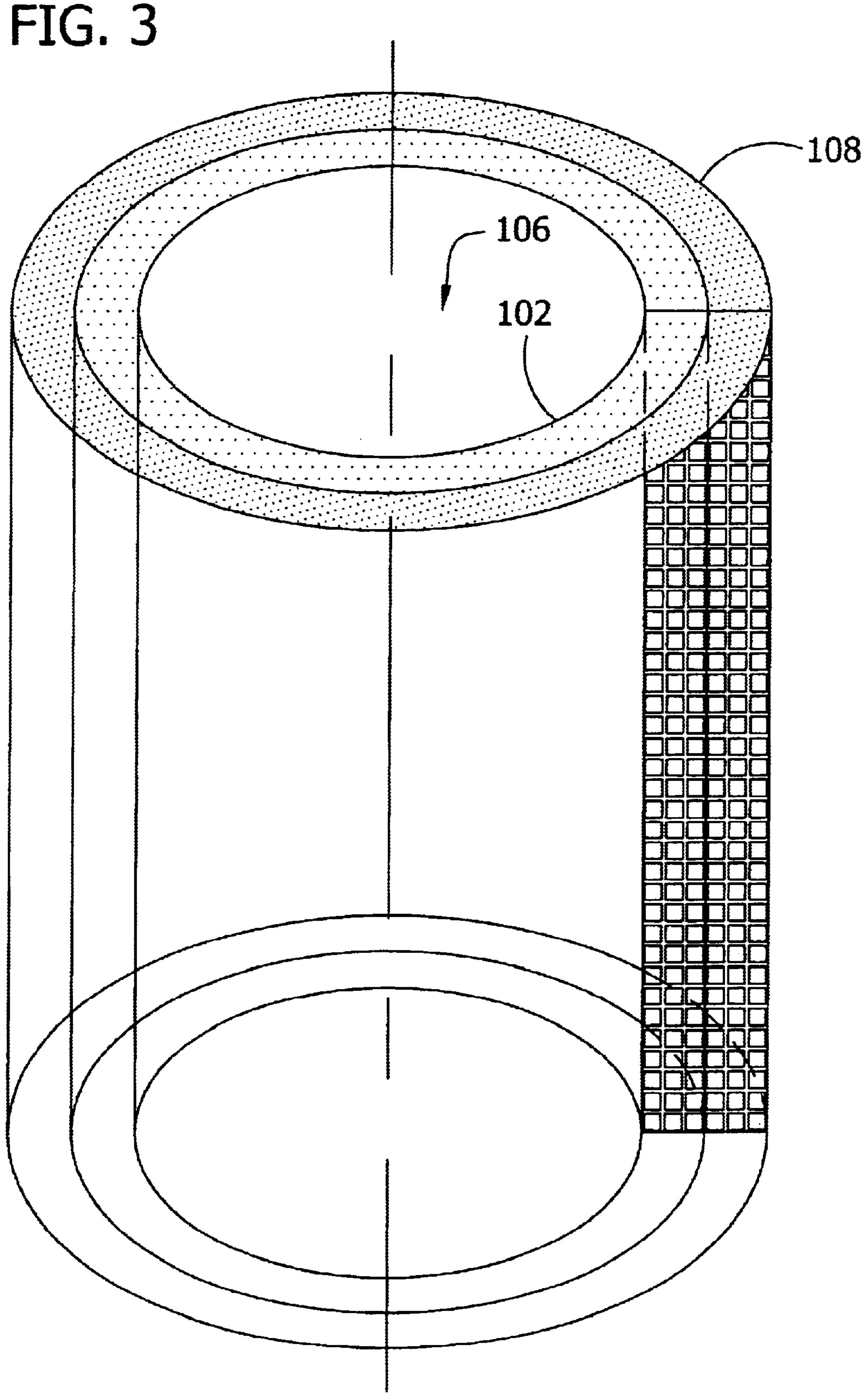
FIG. 3 is a cross sectional view of one coil of the magnet of FIG. 1 having an integral reinforcement winding thereon.
Figure 4:
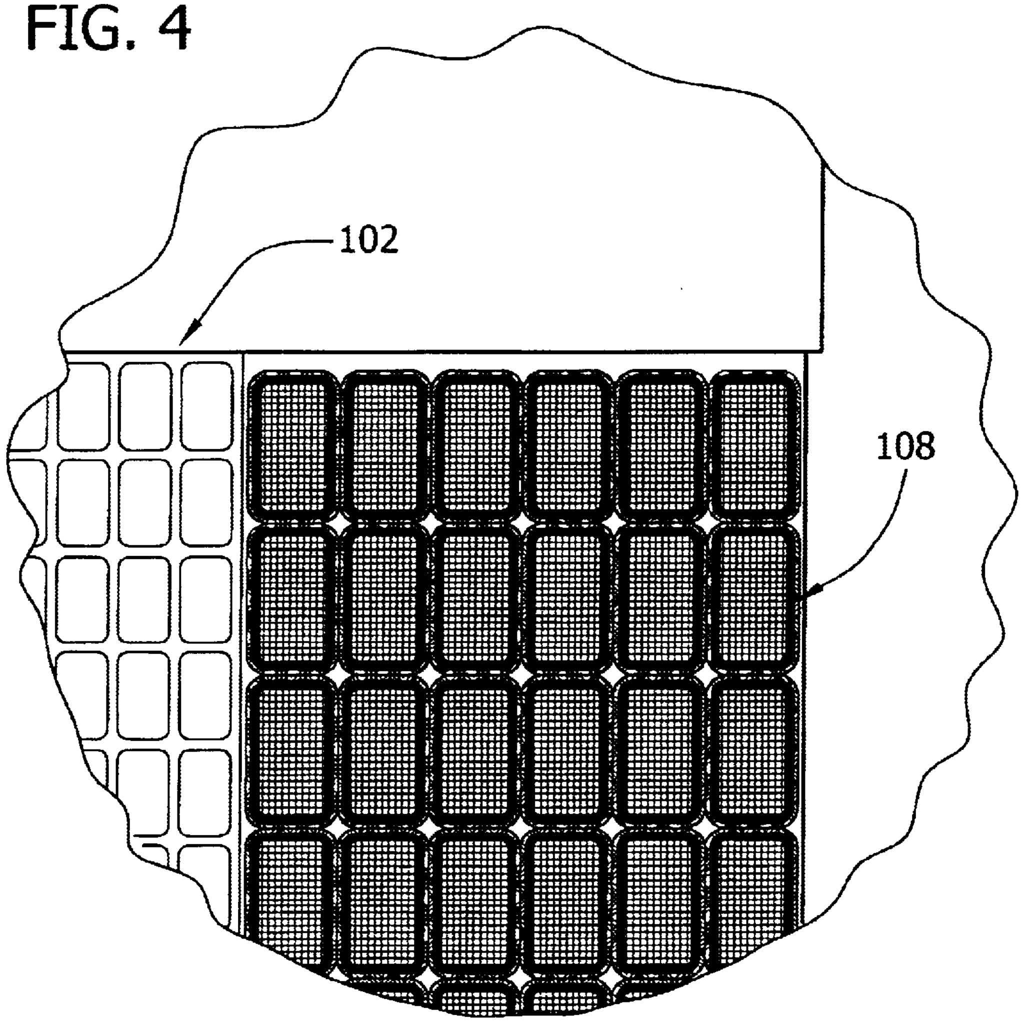
FIG. 4 is an enlarged, fragmentary, cross sectional view of the coil and reinforcement winding of FIG. 3.

Referring now to FIGS. 3 and 4, the magnetic coil construction of the present invention provides selected coils 102 with external reinforcement winding 108. In a reinforced coil 102, the conductor and the reinforcement wire are first wound in sequence and then epoxy impregnated together in a common epoxy impregnation and cure process. The result is a composite structure that is continuous in the bonding matrix material (i.e., the epoxy and any additional fiber introduced for insulation and reinforcement of the epoxy) even though it contains two types of windings (i.e., the superconductor and reinforcement wire). This coil configuration, referred to as having integral external reinforcement, achieves the primary objectives of radial and axial mechanical support of the conductor windings in a superior manner by having essentially the same strength at the interface between coil 102 and reinforcement 108 as within the two.

The process for preparing reinforced coils 102 preferably begins during an intermediate stage of winding when the conductor is still ductile and not as susceptible to damage (e.g., prior to heat treating the $Nb_3Sn$ conductor). Reinforcement 108 in the form of a wire is then wound directly over the conductor in a process that is essentially the same as the process for winding coil 102. In this embodiment of the invention, the wound coil 102 and reinforcement winding 108 are then placed in a furnace for heat treatment if needed to react the conductor in coil 102 to produce a superconductive material. Following heat treatment, the combined coil assembly 102, 108 is filled with epoxy in a standard vacuum impregnation process creating a high strength bond between the epoxy, the superconductor of coil 102, and the wire of reinforcement winding 108.

The reinforcement winding 108, including any insulation on the wire and between layers of wire, must be compatible with the heat treatment. In a preferred embodiment of the invention, reinforcement 108 is a winding of stainless steel wire of high strength and low magnetic permeability. An alloy such as 316, 316L, or 316 LN is suitable, for example. Stainless steel provides a suitable material for use in external reinforcement winding 108 because of its high strength and stiffness. Moreover, stainless steel maintains a high degree of strength even when subjected to the high temperatures associated with heat treatment of conductors 104. It is also contemplated that reinforcement winding 108 uses a steel reinforcement wire including a fraction of copper. A suitable insulation for the reinforcement wire is glass fiber braid (e.g., E-glass or S-glass), which is compatible with the heat treatment and the subsequent epoxy impregnation. In a general sense, external reinforcement 108 maintains mechanical integrity and prevents wire motion in coils 102.

It is contemplated that the wire in reinforcement winding 108 may be round or rectangular in cross section (e.g., a fraction of a millimeter to several millimeters in width) and may be applied with or without insulation. The steel wire may or may not have some fraction of copper content. If the wire has a copper fraction, however, the copper fraction is preferably relatively constant along the length of the wire. For example, a useful copper fraction is in the range of approximately 5% to approximately 25% of the total wire cross section.

In general, limiting the strain in epoxy impregnated coils, such as coils 102, is desired to preserve epoxy bonding and mechanical integrity of the windings. Strain limitation in $Nb_3Sn$ coils, for example, is related to the strain dependence of the critical current. For strain limitation, high modulus in a reinforcement is a benefit. Since a rather large amount of reinforcement 108 is desired for coils 102, the 900 MHz magnet 100 preferably uses steel reinforcement overbanding. Any amount of steel used in a high uniformity magnet raises questions about magnetic materials effects on uniformity. In this embodiment, a preferred maximum permeability criterion for magnet 100 is, for example, 1.02.

Although wax is widely used for impregnation in NMR magnets, wax has significant limitations in coils of increasing stress, such as those in a wide bore, high field magnet. As the size and stress levels in a magnet increase, wax is not satisfactory. There is also a relation between the manner of reinforcement and the impregnant. In a coil of high strength conductor, the design might allow each turn individually to carry a large stress. When the conductor is relatively weak or brittle, however, external reinforcement is often used to support the relatively large axial forces on the coil. With respect to magnet 100, shear at the interface between the conductor and reinforcement wire windings transfers the stress on coil 102 into external reinforcement 108. Epoxy provides a strong impregnation material to accommodate stress transfer in magnet 100. In fact, the epoxy impregnation of the conductor windings in coil 102, the epoxy impregnation of the stainless steel/copper reinforcement overbanding 108, and the epoxy bond of the interface between the two are important to ensuring a sound mechanical structure of each reinforced coil assembly 102, 108.

Advantageously, the external reinforcements 108 according to the invention provide good mechanical integrity in the axial as well as in the radial direction to sustain the mechanical load on coils 102. Ensuring that reinforcement 108 is well filled and bonded to the epoxy permits treating the reinforcement winding mechanically in a manner similar to the conductor windings.

When two windings are in proximity, such as coil 102 and reinforcement winding 108, a mutual magnetic coupling exists between the windings. As a result of this coupling, when one of the windings is energized with a changing current, the resultant field induces voltages and, if continuous, induces currents in the other winding. As such, if a reinforcement is wound on a conductor coil in a manner that the reinforcement wires are electrically shorted to themselves, the voltages induced in the reinforcement winding will cause current flow and electrical dissipation. As the size of the coil increases, these losses become increasingly unacceptable. As a result, the reinforcement 108 on large coils such as coils 102 is preferably treated like the conductor and wound in a manner so that the turns are electrically insulated from one another. This is possible in the present invention by using a glass fiber insulation on the reinforcement wires of reinforcement 108, which is compatible with the high temperature heat treatment. In this instance, reinforcement winding 108 is preferably terminated in electrical leads connected together through a diode. The diode may be connected to the superconducting coil 102 and operate at the reduced temperature of the coil. For example, a cryogenic grade high current press pack diode is suitable for cold service.

Integral external reinforcement of coils 102 as described herein provides several advantages over the prior art. For example, reinforcement 108 is wound directly over conductor coil 102 prior to heat treatment and epoxy impregnation. At this stage, the conductor is still in its ductile form, which eliminates the risk associated with directly winding an external reinforcement on a brittle, heat treated conductor. In other words, integral reinforcement 108 eliminates the need to apply reinforcement in a second operation, and provides the full shear strength of the impregnated windings 102. Also, there is only one setup of each coil 102 in the winding process, as opposed to two windings if an external reinforcement is applied over a finished coil. Integral external reinforcement provides yet another important benefit in that a high quality epoxy composite is achieved throughout coil 102 and reinforcement winding 108 with high strength at the interface between the two materials. In this embodiment of the invention, reinforcement 108 is subject to the annealing and softening of the heat treatment. It is counter-intuitive to anneal a strengthening material in this manner, which helps explain why conventional practice has taught away from integral external reinforcement. Advantageously, the amount of anneal softening that occurs during the heat treatment leaves reinforcement 108 with sufficient strength to meet the design parameters of magnet 100. The fiber insulation on the wire used in reinforcement winding 108 results in material properties in the reinforcement region being similar to that of the conductor regions.

As is well known in the art, superconducting coils 102 may be subject to quench, a malfunction the result of which is the sudden and rapid discharge of the quenched coil. As a secondary result of this discharge, there is the potential for a large induced voltage in the reinforcement windings 108. Shorting the lead wires of each reinforcement winding 108 together will eliminate this voltage by allowing current flow in reinforcement winding 108 during the quench. This configuration, however, also allows current flow in reinforcement 108 during the charging of coil 102, resulting in unacceptable energy losses. Magnet 100 provides a solution to this problem by including a diode across the leads associated with each reinforcement winding 108. During charging of the coils 102, the diodes prevent currents in reinforcement windings 108 and eliminate the resultant energy loss. In the event of a quench, the voltage exceeds the diode threshold and the respective diode conducts, eliminating the potentially high voltage.

In addition, when one of the coils 102 quenches, the dissipation of energy stored in magnet 100 warms the respective conductor 104. Since the thermal conductivity to reinforcement 108 is generally limited, reinforcement 108 tends to stay cooler than conductor 104. In other words, the natural thermal diffusion into reinforcement winding 108 is generally insufficient to adequately reduce the temperature difference between conductor 104 and reinforcement 108. The temperature increase in the respective conductor 104 causes a thermal expansion in both diameter and length. The expansion in turn results in a shear stress between the conductor of coil 102 and its reinforcement 108, particularly for long coils 102. One preferred embodiment of the present invention provides a relatively small fraction of copper in addition to the steel wire in reinforcement winding 108. Advantageously, the copper provides a mechanism for warming reinforcement 108 and, thus, helps eliminate the source of thermal stress in the quenched coil 102. It is to be understood that the wire forming each reinforcement winding 108 may be generally round or rectangular in cross section. For example, such wire may have a stainless steel core covered by a copper jacket and glass fiber braid insulation as shown in FIG. 4 or have a copper core covered by a stainless steel jacket and glass fiber braid insulation.

Those skilled in the art recognize that transferring energy from a winding to an electrical secondary may be used to limit the amount of energy that needs to be dissipated in the winding. In this instance, however, the energy being transferred is not intended for cooling coil 102 but for warming the secondary, i.e., reinforcement winding 108. The amount of energy transferred is relatively small and provides little cooling of the windings. Referring now to the reinforcement windings 108 of magnet 100, the time constant must be sufficiently long for transferring inductive energy from conductor 104 into reinforcement 108. The time constant associated with a pure steel reinforcement winding is relatively short to the extent that little energy is transferred even when the diode conducts and current flows in the secondary circuit formed by reinforcement 108. Thus, one preferred embodiment of the invention employs a reinforcement wire having a small fraction of copper in addition to steel. Such reinforcement wire has a greater conductivity than stainless steel alone, which increases the time constant of the secondary winding formed by reinforcement 108. Preferably, the amount of copper in reinforcement 108 is small enough to keep from unduly weakening reinforcement 108.

Referring further to quench conditions in superconducting magnets, spreading the quench from a local region of a coil throughout the entire coil provides a much greater region for energy to dissipate as heat and, thus, decreases the energy density in the local region. This greatly reduces the potential for overheating and is the basic purpose and function of internal quench protection systems for magnets. The present invention involves the active protection circuit 112 for protecting large multi-coil magnets, such as magnet 100. Protection circuit 112 preferably includes a network of heater elements 114 to cause a global quench in magnet 100 if a quench occurs in any single coil 102. Preferably, the individual heater elements 114 are distributed about each coil 102 and among a number of separate coils 102 and are attached in thermal contact with the coils 102. In this configuration, heater elements 114 can spread a quench more quickly than the natural process of thermal conduction.

In a preferred embodiment, an active quench detector 116 monitors voltages across coils 102 via a series of voltage taps 118 to identify when a quench condition begins in any one of the monitored coils 102. Upon identification of a quench condition, an external power source 120 responsive to the quench detector circuit 116 drives a protection switch 122 for enabling the network of heaters 114. The protection switch 122, connected in parallel with the heater network, causes the stored energy of magnet 100 itself to power heater elements 114. In this manner, heaters 114 distribute and dissipate the stored energy over all of the coils 102. The majority of the main magnet current flows in the heater network during the forced global quench, delivering as much as 35 kW, for example, at full current.

The heaters 114 preferably reside on an outside surface of coils 102. On the reinforced coil assemblies, heaters 114 are preferably positioned between coil 102 and reinforcement 108. The performance of the protection system 112 relies on achieving low activation times for normalization of protection switch 122 and initiation of the global quench. Those skilled in the art will recognize that, on most coils 102, placing heaters 114 under the reinforcement windings 108 shields the heaters 114 from the cooling influence of the superfluid helium, as is generally true for the outside surface of coils 102 themselves.

An important feature of heaters 114 is that they are in good thermal contact with coils 102. This permits quench protection system 112 of the present invention to operate very quickly to prevent quench conditions from damaging the magnet coils 102. In general, if heaters 114 are applied to coils 102 in close proximity to the conductor windings before the epoxy impregnation process, they are more likely to be in better thermal contact with the conductor windings. It is to be understood, however, that heaters 114 may be applied to coils 102 before or after the epoxy impregnation process without deviating from the scope of the invention.

As is well known in the art, high mechanical stress in the windings of a superconducting coil can lead, indirectly, to a quench. Whenever there is an input of heat in a local region of a coil such that the temperature is raised sufficiently, characterized by the critical temperature of the superconductor at the operating conditions, a coil is likely to quench. One source of heat is localized cracking of the epoxy encapsulant, which is accompanied by stress relief and energy release. Heater element 114, epoxied into or onto coil 102, represents a local feature that can be associated with increased stress. Absent the improvements described below, the presence of heater 114 may cause epoxy cracking and become the source of a quench. One possible configuration for heater element 114 is a flat strip of normal, non-superconducting, metal having a relatively high resistivity. The strip may be applied to the coil before or after epoxy impregnation. Included in an appropriate circuit, the ohmic loss in the strip provides the heat to cause the spread of quench in the coil. Unfortunately, the combination of thermal contraction from cool-down and displacement during operation of such strip is accompanied by high stress and the potential for epoxy cracking at the heater element.

Referring now to FIGS. 6A and 6B and FIGS. 7A and 7B, a preferred embodiment of the invention employs a flat metallic braid as heater element 114 to reduce the likelihood of epoxy cracking. The metallic braid heater element 114 behaves electrically as a resistive element to produce heat and mechanically in a manner to limit the stress about the heater in coil 102.

Since it is relatively thin and flat, heater element 114 promotes the transfer of heat to the conductor windings of coil 102 and is compatible with other design features, such as the ability to be placed between coil 102 and reinforcement 108. Preferably, heater element 114 is a braid of ductile, resistive metal or alloy. Advantageously, a braid construction is significantly more compliant than a uniform strip, even when it is impregnated with epoxy as part of the coil construction. Thus, heater 114 according to the present invention serves to greatly decrease the stress at the heater during the operation of the superconducting coil. For example, heater element 114 is a flat braid of fine stainless steel wires about 1 cm wide and about 0.1 mm thick. The width of the braid may vary from a few millimeters to a few centimeters and its thickness may be several times thicker than 0.1 mm. A rolling operation may be used to substantially reduce the thickness of such a braid. In a preferred embodiments, layers of glass cloth insulate the braid to electrically isolate heater element 114 from the windings of coil 102. The glass cloth fills with epoxy during the impregnation and forms an epoxy-glass insulator layer between heater element 114 and coil 102.

Figure 7B:
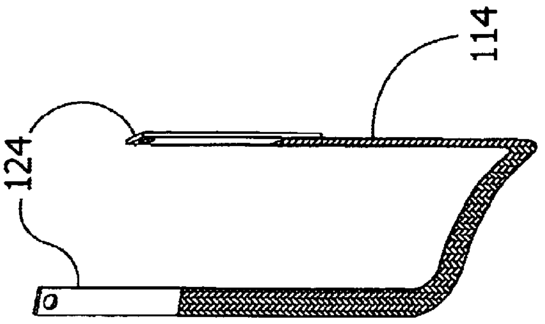
FIGS. 7A and 7B are front plan and perspective views, respectively, of another heater element for use with the protection circuit of FIG. 5.
Figure 7A:
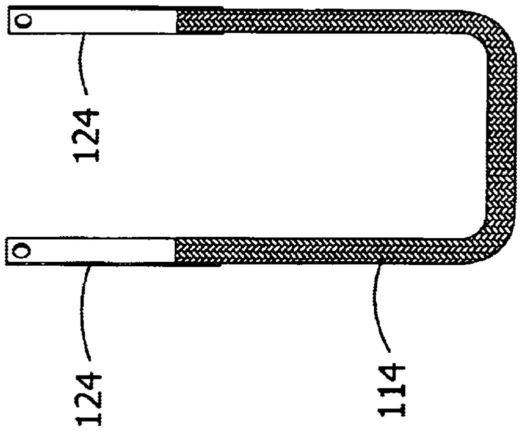
Figure 6B:
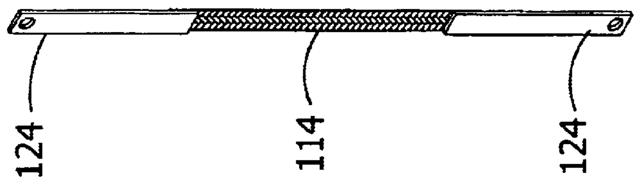
FIGS. 6A and 6B are front plan and perspective views, respectively, of a heater element for use with the protection circuit of FIG. 5.
Figure 6A:
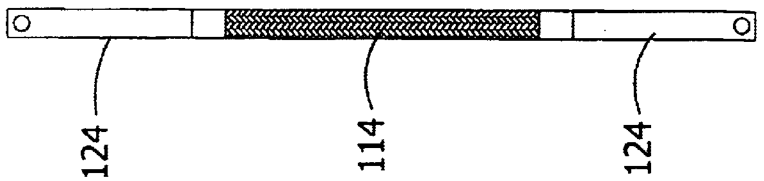

As shown in FIGS. 6A and 6B and FIGS. 7A and 7B, protection circuit heater element 114 preferably includes electrical connectors 124 attached to its ends for facilitating the connection to the electrical circuit provided for quench protection. In an alternative embodiment, external wires connect directly to the braid. The ends of heater element 114 also extend away from the body of coil 102 to allow easy attachment of external wires to the electrical connectors. FIGS. 6A and 6B illustrate one embodiment in which heater element 114 is a generally straight section of braid, extending from one end of coil 102 axially to the other, with the ends of element 114 extending in both directions past the length of coil 102 to facilitate electrical connection at the ends of heater element 114. Alternatively, the heater element is generally U-shaped, having a hairpin bend as shown in FIGS. 7A and 7B, or another shape that results in both ends of heater element 114 being at one end of coil 102.

Due to the brittle nature of heat treated $Nb_3Sn$ coils, there is some advantage to applying heater elements 114 to coils 102 prior to heat treatment. In this instance, the potential to damage the superconducting windings during application of heater element 114 after heat treatment and before epoxy impregnation is greatly reduced. Heater element 114 preferably comprises a flat braid of a resistive, high temperature metal or alloy, applied without any organic based insulations that would be subject to decomposition during heat treatment. As such, heater element 114 is capable of sustaining the high temperatures during the heat treating process and meets the needs of Nb3Sn wind and react coil technology.

Although described above with respect to coils 102, it is to be understood that heater elements 114 may also be applied to compensation coils 104. A protection diode preferably bridges compensation coils 104 to prevent asymmetric quench.

Figure 8:
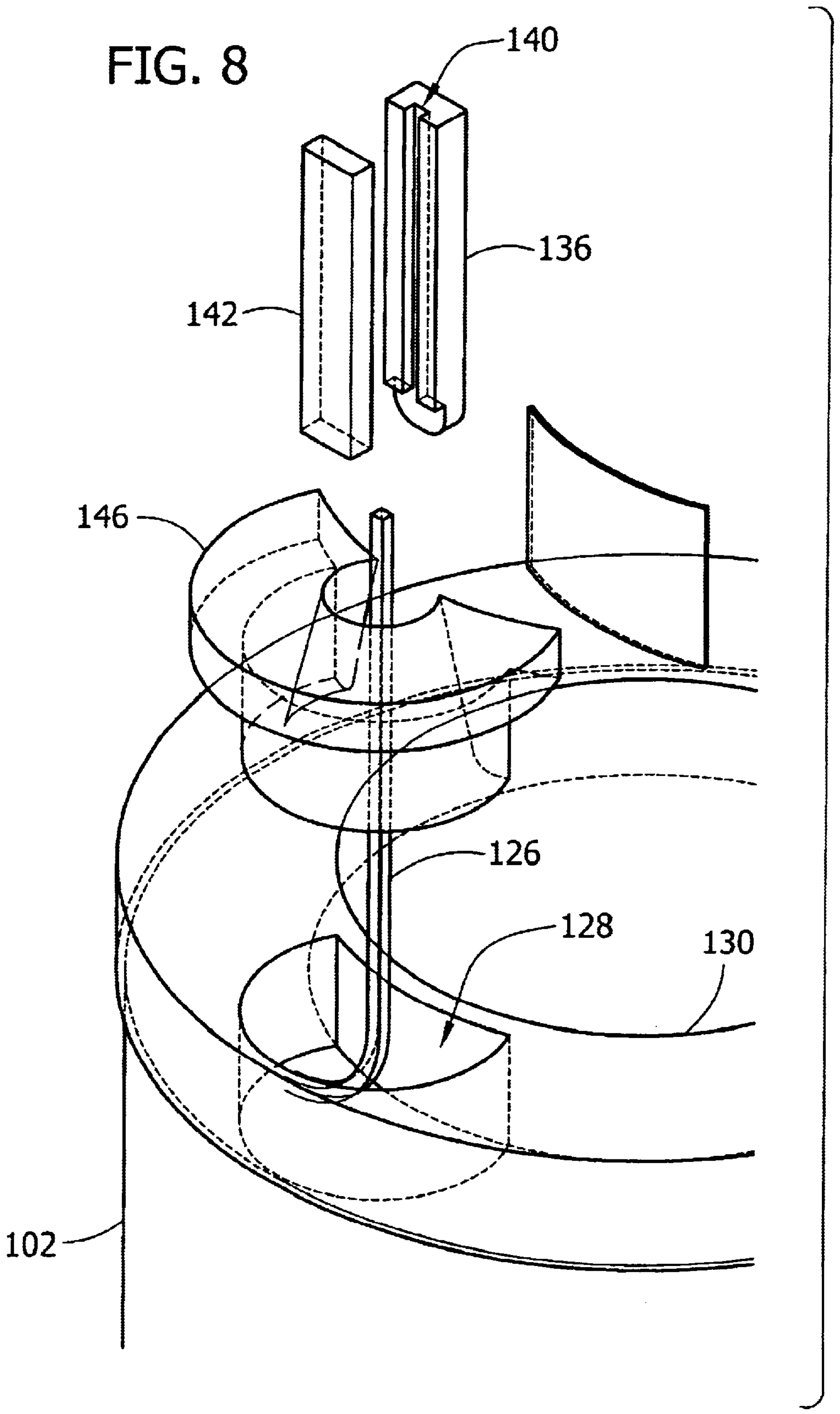
FIG. 8 is an exploded, perspective view of a lead support structure for use with the magnet of FIG. 1.
Figure 9:
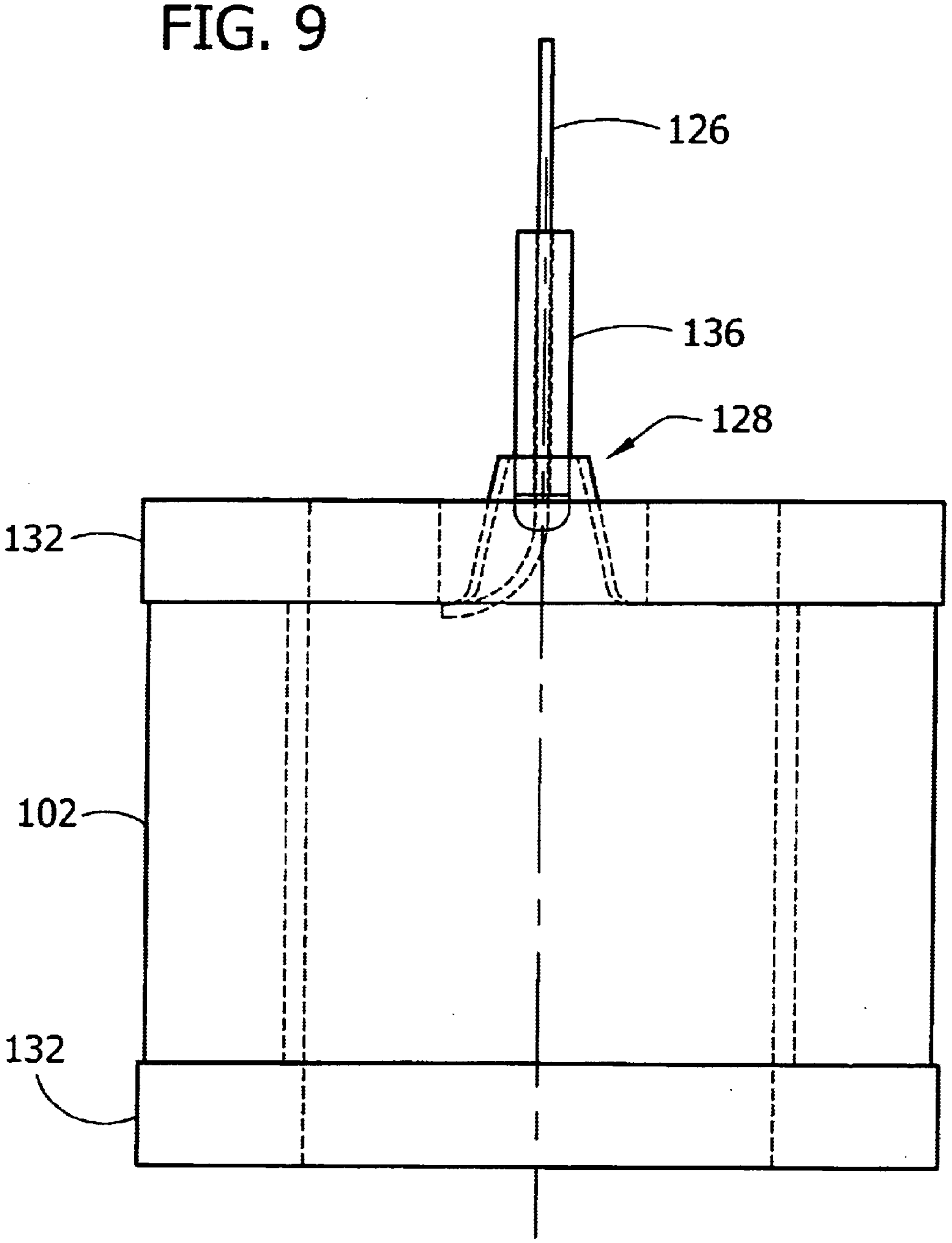
FIG. 9 is a front plan of a lead cone assembly formed by the support structure of FIG. 8.
Figure 10:
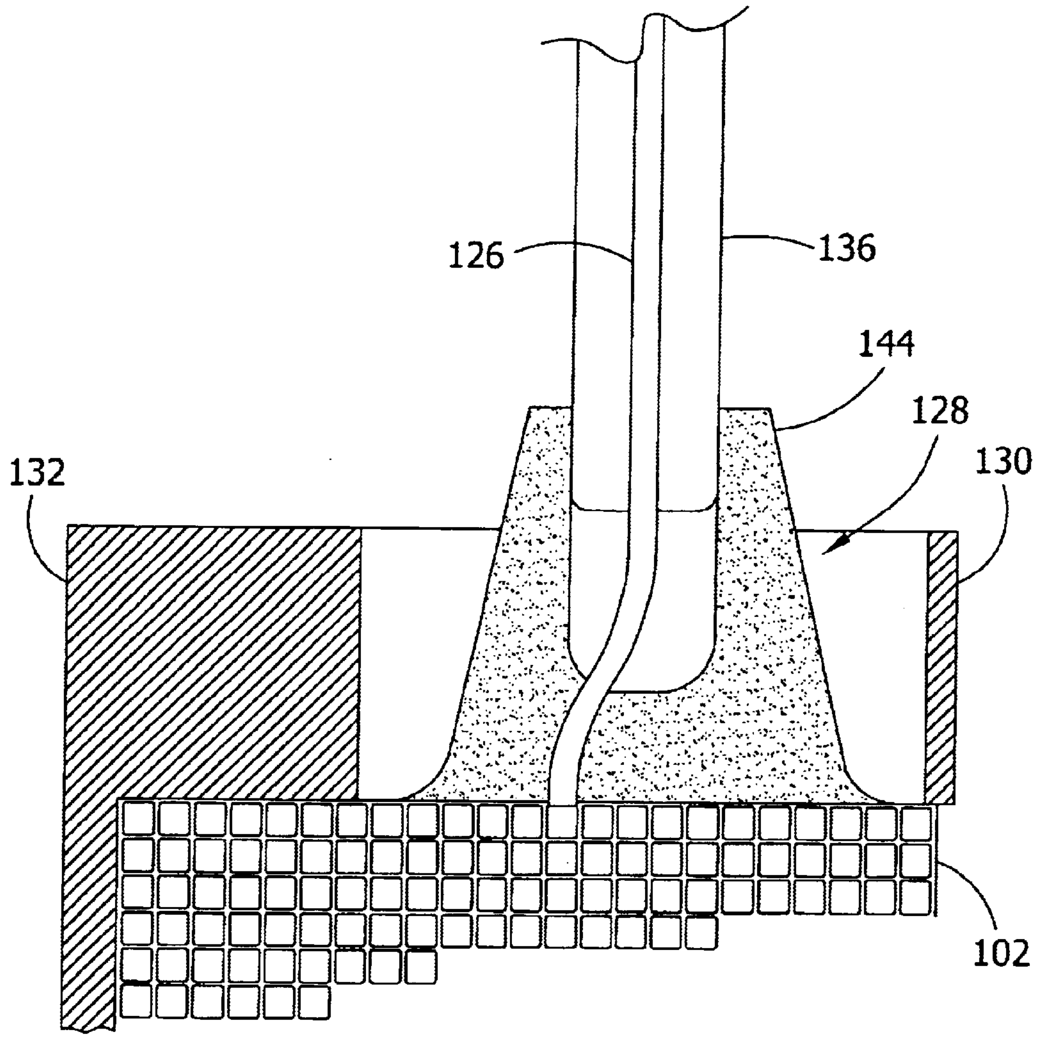
FIG. 10 is a cross sectional view of the lead cone assembly of FIG. 9.

Referring now to FIGS. 8–10, the present invention provides a system for fabricating and supporting a lead wire 126 of a superconducting coil, such as any one of coils 102, 104. For simplicity, the lead 126 will be discussed with respect to a single coil 102, although it is to be understood that the invention is applicable to any of the coils 102, 104 or other winding configuration. Those skilled in the art recognize that superconducting coils 102, 104 each have leads 126 formed during fabrication of the coils through which the coils are electrically energized.

The lead wire 126 preferably extends through a hole or opening 128 in an end flange 130. In the illustrated embodiment, the end flange 130 is part of a coil form 132 on which the conductor is wound to form coil 102. The present invention encompasses application to the brittle superconductors that are placed into and held in a fixed position during coil winding by means of some structure for lead support during fabrication. In this instance, a copper stabilizing member, or stabilizer, 136 constitutes a lead support structure providing mechanical support and positioning of lead wire 126 prior to heat treatment of the conductor. The stabilizer 136 preferably has a channel 140 therethrough in which lead wire 126 is positioned. A cover strip 142 holds lead 126 in the channel 140 of stabilizer 136. Preferably, the hole 128 in end flange 130 is large enough to accommodate an epoxy lead cone 144 that is eventually formed in that space.

During winding of coil 102, and for subsequent processing, additional support for lead 126 immediately as it exits the windings may be provided in the form of curved shoe pieces (not shown) that are positioned in the lead exit hole 128 and held by end flange 130. The shoe pieces help maintain the position of stabilizer 136. In placing the wire into lead exit hole 128, the lead wire 126 is bent to a curvature for matching the size of hole 128 and the position of the lead supporting structure of the shoe pieces and stabilizer 136. Since lower field superconductors such as NbTi are ductile and do not require a heat treatment, the lead supporting structure helps position the conductor at the lead exit during winding but otherwise may be omitted.

During the heat treatment, the conductor is held in a fixed position by the support structure, including copper stabilizer 136, into which it was positioned. After heat treatment, without moving the conductor, lead wire 126 is preferably soldered into the copper channel 140. At this time, the shoes, which helped to position the conductor just at the point of leaving the windings, are removed without disturbing the position of the conductor. Removing the shoes leaves only lead wire 126 and one end of stabilizer 136 within hole 128 in end flange 130.

Without disturbing lead 126, an epoxy cone mold 146 is preferably positioned within lead exit hole 128 about lead wire 126. The mold 146 form a boundary of a region about the lead 126. In a preferred embodiment of the invention, this region defines a generally conical support structure, or lead cone assembly 144, when mold 146 is filled with epoxy (and filler material). Prior to epoxy impregnation, mold 146 is preferably filled with a material such a glass fiber, quartz fiber, alumina, or possibly other materials that are commonly used to make filled epoxy composites. The end of the stabilizer 136 extends into the conical region defined by mold 146 and is surrounded by the filler material. After filling, the top of the conical region is defined by a cover plate (not shown). In one embodiment, mold 146 is aluminum. Treating mold 146 with an epoxy release agent will facilitate its removal following the impregnation process. It is to be understood that the term "conical" as used herein is intended to include other shapes without deviating from the scope of the present invention (e.g., lead cone assembly 144 may be truncated, or generally frustoconical).

During the vacuum impregnation process, the void and fiber region within the windings is filled with epoxy. At the same time, the filled region of mold 146 surrounding lead 126 is filled with epoxy. After the epoxy is cured, the excess epoxy about the body of coil 102 may be removed. Removing mold 146 reveals the conical-shaped filled epoxy structure, i.e., lead cone assembly 144, about lead 126. Since it is filled with epoxy and cured along with the windings, the resulting lead cone 144 is integrally formed with coil 102 making issentially an extension of the windings. Lead cone 144 surrounds, encapsulates and supports the lead wire 126. Advantageously, lead cone 144 also encapsulates and holds the end of copper stabilizer 136 to protect the point at which lead 126 enters and is soldered to the stabilizer channel 140.

The present invention applies to coils that are epoxy impregnated, such as by a vacuum impregnation process, but use with a wet layup epoxy process is also contemplated.

Referring now to FIG. 10, the design of mold 146 preferably leaves a region of clearance between epoxy cone 144 and the inside of the end flange hole 128. This space allows the windings of coil 102 to move relative to the end flange 130 of coil form 132 without cone 144 coming into contact with end flange 130.

Figure 11:
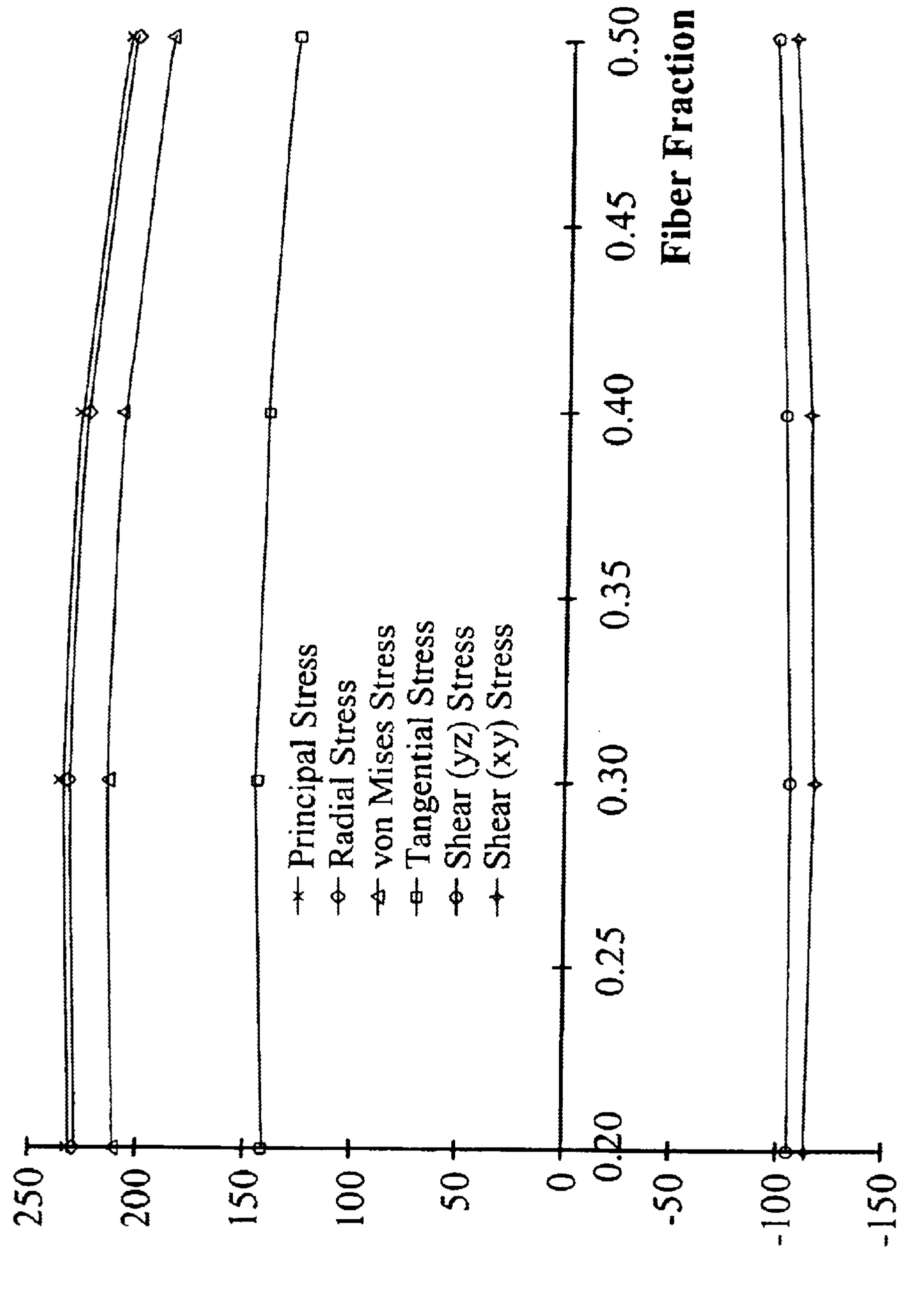
FIG. 11 illustrates exemplary stress data for the lead cone assembly of FIG. 9.

FIG. 11 illustrates exemplary stress data for lead cone assembly 144. The computed material properties of cone 144 with an alumina powder filler show increased stiffness and increased differential thermal contraction in comparison with an E-glass fiber filler. As a consequence, maximum thermal stress is found to be significantly higher with the alumina filler in a comparison with 50% filler fraction.

Persistent joints are positioned in relatively low field at the ends of the lead support structures. The joints include splice joints within coils and termination joints at the start and finish of coils. $Nb_3Sn$ splice joints are over metallurgy technology. All other joints, including $Nb_3Sn$—NbTi and NbTi—NbTi joints are superconducting solder technology. Bucking coils are preferably employed to decrease the field at the joints. The bucking coils are especially useful on the $Nb_3Sn$—NbTi joints. The coils will be persistent, wound of single core conductor, with persistent joint and switches. Individual coils are connected through NbTi leads and an intermediate NbTi—NbTi joint. The interconnection lead must be flexible t the extent required by relative coil motions, and must be stable.

The magnet 100 also employs two persistent switches, i.e., a main switch and a protection switch. In one embodiment, the switches contain NbTi/CuNi matrix conductor in a seven strand cable. The switches are bifilar wound and epoxy impregnated. The main switch is situated in the 4 degrees K container due to the heat load and helium consumption during ramping. The protection switch is in parallel with the protection heater network and capable of rapid turn on. When the protection switch is normal, during the operation of the heaters, it experiences heating as a parallel resistor, and must be designed accordingly.

Protection of epoxy impregnated magnets requires careful design and analysis of all factors that affect the winding temperature rise before it reaches quench temperature. Among these factors is the AC loss due to current and field change as a result of the current transfer between coils after the protection diodes voltages exceed their critical values.

Protection of large energy stored epoxy impregnated magnets requires using diodes across many sections of magnet 100 system to allow for inductive current transfer from sections with normal zones to the other superconducting sections. As a result, the current decays in one section and increases in the other sections leaving the total field almost unchanged at the beginning of a quench. As a result, the transverse field loss is very small at that time; however in the circuit where the normal zone exists, the self-field losses can contribute to the acceleration of the normal zone propagation and it is expected that the coils in that circuit to normalize faster than other circuits.

Magnetic field uniformity is critical to NMR. Ferromagnetic welds cause field in homogeneity. Historically, magnet designs have avoided ferrous structural alloys to prevent potential field distortions from welds. This strategy is problematic in fabricating high field magnets because austenitic stainless steel is the preferred heat treatment material for bore tubes in niobium-tin coils. Early high field NMR designs employed the removal of the bore tubes after heat treatment and epoxy impregnation. Bore tube removal is dangerous due to the risk of damaging the reacted NbTi conductor and leads. A more practicable fabrication approach is to leave the stainless steel bore tubes in place. The weld metal on the coil form must then have a low permeability to avoid distorting magnetic fields. Low permeability is accomplished by producing zero ferrite welds. This involves the selection of base metals and welding alloys, the welding process, and supporting magnetic permeability measurement results.

A $Nb_3Sn$ coil requires a form that will support and geometrically define its windings during heat treatment. Previous NMR coil constructions have employed the removal of the bore tubes after heat treatment and epoxy impregnation. The strategy was to avoid the potential field distortion issues by removing all suspect material. Bore tube removal after heat treatment is dangerous due to the risk of damaging the $Nb_3Sn$ conductor and insulation. The risk and potential for breakage increases with larger more massive coil assemblies. A more practicable fabrication approach, in large magnets, is to leave the stainless steel bore tubes in place.

Preferably, the coil form steel is low in permeability to avoid large magnetic field distortions. As an example, the permeability limit for the 900 MHz magnet 100 of the present invention is $\mu/\mu_0$=1.020. Coil form welds must also meet this permeability limit as their spatial distribution is typically quite asymmetric in a magnet.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method of manufacturing a superconducting magnet comprising:

winding a plurality of superconducting coils including winding at least one coil of wind and react conductor;

externally reinforcing the wind and react coil;

heat treating, after externally reinforcing, the wind and react coil to react the wind and react conductor;

impregnating, after heat treating, the coils with epoxy;

nesting the coils within each other, an innermost one of the nested coils having a bore therethrough defining a bore width of the magnet, said bore width being greater than approximately 100 millimeters;

electrically connecting the nested coils in series;

cooling the nested coils to an operating temperature less than approximately 4 degrees K; and supplying power to the nested coils for charging the magnet.

2. A method of manufacturing a superconducting magnet comprising:

winding a plurality of superconducting coils;

externally reinforcing at least one of the coils;

impregnating, after externally reinforcing, the coils with epoxy;

nesting the coils within each other, an innermost one of the nested coils having a bore therethrough defining a bore width of the magnet, said bore width being greater than approximately 100 millimeters;

electrically connecting the nested coils in series;

cooling the nested coils to an operating temperature less than approximately 4 degrees K; and supplying power to the nested coils for charging the magnet.

3. The method of claim 2 wherein the reinforcing step includes winding a reinforcement wire around the at least one of the coils to be externally reinforced.

4. The method of claim 3 wherein the reinforcement wire is electrically insulated with a high temperature insulation.

5. The method of claim 4 wherein the high temperature insulation is a glass fiber braid.

6. The method of claim 3 wherein the reinforcement wire is electrically insulated and wherein the step of winding the reinforcement wire includes preventing electrical short circuits of the reinforcement wire to itself.

7. The method of claim 3 wherein the reinforcement wire is steel.

8. The method of claim 3 wherein the reinforcement wire includes steel and copper.

9. The method of claim 3 wherein the reinforcement wire wound on the at least one of the coils to be externally reinforced defines an external reinforcement winding, said external reinforcement winding having a pair of leads extending therefrom, and further comprising the step of connecting the leads of the external reinforcement winding with a diode.

10. A method of manufacturing a superconducting magnet comprising:

winding a plurality of superconducting coils;

protecting at least one of the coils with a heater element for heating the protected at least one of the coils in response to a quench in the magnet, said heater element comprising a substantially flat metallic braid;

impregnating the coils with epoxy;

nesting the coils within each other, an innermost one of the nested coils having a bore therethrough defining a bore width of the magnet, said bore width being greater than approximately 100 millimeters;

electrically connecting the nested coils in series;

cooling the nested coils to an operating temperature less than approximately 4 degrees K; and supplying power to the nested coils for charging the magnet.

11. The method of claim 10 wherein the braid comprises a resistive metal.

12. The method of claim 10 further comprising rolling the braid to lessen its thickness.

13. The method of claim 10 wherein the braid is generally U-shaped.

14. A method of manufacturing a superconducting magnet comprising:

winding a plurality of superconducting coils;

protecting at least one of the coils with a heater element for heating the protected at least one of the coils in response to a quench in the magnet, said protecting including positioning the heater element in thermal contact with the protected at least one of the coils;

impregnating, after positioning the heater element, the coils with epoxy;

nesting the coils within each other, an innermost one of the nested coils having a bore therethrough defining a bore width of the magnet, said bore width being greater than approximately 100 millimeters;

electrically connecting the nested coils in series;

cooling the nested coils to an operating temperature less than approximately 4 degrees K; and supplying power to the nested coils for charging the magnet.

15. A method of manufacturing a superconducting magnet comprising:

winding a plurality of superconducting coils, said winding the superconducting coils including winding one or more coils of wind and react conductor;

heat treating the one or more wind and react coils to react the wind and react conductor;

protecting at least one of the coils with a heater element for heating the protected at least one of the coils in response to a quench in the magnet, said protecting positioning the heater element in thermal contact with the protected at least one of the coils;

impregnating, after heat treating and positioning the heater element, the coils with epoxy;

nesting the coils within each other, an innermost one of the nested coils having a bore therethrough defining a bore width of the magnet, said bore width being greater than approximately 100 millimeters;

electrically connecting the nested coils in series;

cooling the nested coils to an operating temperature less than approximately 4 degrees K; and supplying power to the nested coils for charging the magnet.

16. A method of manufacturing a superconducting magnet comprising:

winding a plurality of superconducting coils;

supporting, with epoxy, one or more lead wires extending from the superconducting coils, said supporting includes placing a mold around the one or more of the lead wires adjacent an end of the superconducting coils and filling the mold with a filler material, said mold defining a generally frustoconical region surrounding at least a portion of the one or more of the lead wires;

impregnating, after filling the mold, the coils with epoxy;

nesting the coils within each other, an innermost one of the nested coils having a bore therethrough defining a bore width of the magnet, said bore width being greater than approximately 100 millimeters;

electrically connecting the nested coils in series;

cooling the nested coils to an operating temperature less than approximately 4 degrees K; and supplying power to the nested coils for charging the magnet.

17. The method of claim 16 further comprising the step of securing a portion of the one or more of the lead wires within a stabilizing member, at least a portion of said stabilizing member being adapted to extend into the mold.

18. A method of manufacturing a superconducting magnet comprising the steps of:

winding a plurality of superconducting coils;

externally reinforcing at least one of the coils;

impregnating the coils with epoxy following the reinforcing step;

nesting the coils within each other;

electrically connecting the nested coils in series;

cooling the nested coils to an operating temperature less than approximately 4 degrees K; and supplying power to the nested coils for charging the magnet.

19. The method of claim 18 wherein the step of winding the superconducting coils includes winding one or more coils of wind and react conductor and heat treating the one or more wind and react coils to react the wind and react conductor following the reinforcing step and prior to the impregnating step.

20. The method of claim 18 wherein the reinforcing step includes winding a reinforcement wire around the at least one of the coils to be externally reinforced.

21. The method of claim 20 wherein the reinforcement wire is electrically insulated with a high temperature insulation.

22. The method of claim 21 wherein the high temperature insulation is a glass fiber braid.

23. The method of claim 20 wherein the reinforcement wire is electrically insulated and wherein the step of winding the reinforcement wire includes preventing electrical short circuits of the reinforcement wire to itself.

24. The method of claim 20 wherein the reinforcement wire is steel.

25. The method of claim 20 wherein the reinforcement wire includes steel and copper.

26. The method of claim 20 wherein the reinforcement wire wound on the at least one of the coils to be reinforced defines an external reinforcement winding, said external reinforcement winding having a pair of leads extending therefrom, and further comprising the step of connecting the leads of the external reinforcement winding with a diode.

27. A method of manufacturing a superconducting magnet comprising the steps of:

winding a plurality of superconducting coils;

positioning a heater element in thermal contact with one or more of the coils for heating the coils in response to a quench in the magnet;

impregnating the coils with epoxy following the step of positioning the heater element;

nesting the coils within each other;

electrically connecting the nested coils in series;

cooling the nested coils to an operating temperature less than approximately 4 degrees K; and supplying power to the nested coils for charging the magnet.

28. The method of claim 27 wherein the heater element comprises a substantially flat metallic braid.

29. The method of claim 28 wherein the braid comprises a resistive metal.

30. The method of claim 28 further comprising rolling the braid to lessen its thickness.

31. The method of claim 28 wherein the braid is generally U-shaped.

32. The method of claim 27 wherein the step of winding the superconducting coils includes winding one or more coils of wind and react conductor and heat treating the one or more wind and react coils to react the wind and react conductor following the step of positioning the heater element and prior to the impregnating step.

* * * * *